United States Patent
Zhang (10) Patent No.: US 10,101,427 B2
(45) Date of Patent: Oct. 16, 2018

(54) MAGNETIC RESONANCE IMAGING METHOD AND APPARATUS

(71) Applicant: Siemens Aktiengesellschaft, Munich (DE)

(72) Inventor: Qiong Zhang, Shenzhen (CN)

(73) Assignee: Siemens Aktiengesellschaft, Munich (DE)

(*) Notice: Subject to any disclaimer, the term of this patent is extended or adjusted under 35 U.S.C. 154(b) by 605 days.

(21) Appl. No.: 14/735,606

(22) Filed: Jun. 10, 2015

(65) Prior Publication Data

US 2015/0355301 A1 Dec. 10, 2015

(30) Foreign Application Priority Data

Jun. 10, 2014 (CN) .......................... 2014 1 0254111

(51) Int. Cl.
*G01V 3/00* (2006.01)
*G01R 33/561* (2006.01)
*G01R 33/48* (2006.01)

(52) U.S. Cl.
CPC ...... *G01R 33/5611* (2013.01); *G01R 33/4822* (2013.01); *G01R 33/4826* (2013.01); *G01R 33/5615* (2013.01)

(58) Field of Classification Search
CPC ............ G01R 33/5611; G01R 33/4822; G01R 33/4826; G01R 33/5615; G01R 33/4818
(Continued)

(56) References Cited

U.S. PATENT DOCUMENTS

| 8,150,491 | B2* | 4/2012 | Jung | ................. | G01R 33/5611 |
| | | | | | 345/418 |
| 8,405,395 | B2* | 3/2013 | Setsompop | ........ | G01R 33/4835 |
| | | | | | 324/309 |

(Continued)

FOREIGN PATENT DOCUMENTS

| CN | 104714199 A | * | 6/2015 | ......... G01R 33/5611 |
| CN | 105334479 A | * | 2/2016 | ......... G01R 33/5611 |

(Continued)

OTHER PUBLICATIONS

Zwaag et. al., High Spatio-Temporal Resolution in Functional MRI With 3D Echo Planar Imaging Using Cylindrical Excitation and a CAIPIRINHA Undersampling Pattern, International Society for Magnetic Resonance in Medicine, 2017.*

(Continued)

*Primary Examiner* — Patrick Assouad
*Assistant Examiner* — Sean Curtis
(74) *Attorney, Agent, or Firm* — Schiff Hardin LLP (57) ABSTRACT

An MRI method and apparatus perform a 3D dual echo magnetic resonance scan to acquire two sets of k-space data corresponding to the two echoes, respectively. A 2D CAIPIRINHA undersampling method as applied to the two sets of k-space data to extract two sets of sampling data, which are used to reconstruct two initial magnetic resonance images from which a final magnetic resonance image is synthesized. Because staggering is carried out in the PE or SL direction when the 2D CAIPIRINHA undersampling method is applied to the 3D scan sequence, aliasing in parallel imaging is controlled, so a greater area in the center of the field of view is undisturbed by aliasing. Coil sensitivity also is increased, enabling further acceleration. 2D CAIPIRINHA undersampling method generally uses a small (Continued)

acceleration factor, thereby ensuring a high signal to noise ratio.

10 Claims, 7 Drawing Sheets

(58) Field of Classification Search
USPC .................................................. 324/300–322
See application file for complete search history.

(56) References Cited

U.S. PATENT DOCUMENTS

| | | | | |
|---|---|---|---|---|
| 8,717,020 | B2* | 5/2014 | Griswold | A61B 5/055 324/307 |
| 8,981,776 | B2* | 3/2015 | Setsompop | G01R 33/54 324/309 |
| 9,035,653 | B2* | 5/2015 | Hutter | G01R 33/5611 324/307 |
| 9,086,468 | B2* | 7/2015 | Duerk | G01R 33/5614 |
| 9,244,144 | B2* | 1/2016 | Blumhagen | G01R 33/56563 |
| 9,297,873 | B2* | 3/2016 | Block | G01R 33/5611 |
| 9,414,766 | B2* | 8/2016 | Jesmanowicz | A61B 5/055 |
| 9,594,134 | B2* | 3/2017 | Smith | G01R 33/446 |
| 9,689,948 | B2* | 6/2017 | Ugurbil | G01R 33/5615 |
| 9,753,110 | B2* | 9/2017 | Porter | G01R 33/54 |
| 9,778,336 | B2* | 10/2017 | Polimeni | G01R 33/4835 |
| 9,778,338 | B2* | 10/2017 | Setsompop | G01R 33/543 |
| 2004/0222794 | A1* | 11/2004 | Griswold | G01R 33/5611 324/309 |
| 2008/0242972 | A1* | 10/2008 | Jung | G01R 33/5611 600/410 |
| 2011/0096092 | A1* | 4/2011 | Griswold | A61B 5/055 345/630 |
| 2011/0254548 | A1* | 10/2011 | Setsompop | G01R 33/4835 324/309 |
| 2013/0049752 | A1* | 2/2013 | Hutter | G01R 33/5611 324/309 |
| 2013/0076352 | A1* | 3/2013 | Block | G01R 33/5611 324/307 |
| 2013/0082702 | A1* | 4/2013 | Blumhagen | G01R 33/56563 324/309 |
| 2013/0099784 | A1* | 4/2013 | Setsompop | G01R 33/54 324/309 |
| 2013/0271128 | A1* | 10/2013 | Duerk | G01R 33/5611 324/307 |
| 2014/0218026 | A1* | 8/2014 | Moeller | G01R 33/4835 324/309 |
| 2014/0225612 | A1* | 8/2014 | Polimeni | G01R 33/4835 324/309 |
| 2014/0253120 | A1* | 9/2014 | Ugurbil | A61B 5/055 324/309 |
| 2015/0084629 | A1* | 3/2015 | Porter | G01R 33/54 324/309 |
| 2015/0168526 | A1* | 6/2015 | Kang | G01R 33/5615 324/309 |
| 2015/0355301 | A1* | 12/2015 | Zhang | G01R 33/5611 324/309 |
| 2015/0362574 | A1* | 12/2015 | Wu | G01R 33/4835 324/322 |
| 2016/0018499 | A1* | 1/2016 | Bornert | G01R 33/5611 324/309 |
| 2016/0033607 | A1* | 2/2016 | Sun | G01R 33/5616 324/309 |
| 2016/0041247 | A1* | 2/2016 | Feiweier | A61B 5/055 324/309 |
| 2016/0069973 | A1* | 3/2016 | Fenchel | G01T 1/1603 324/309 |
| 2016/0154079 | A1* | 6/2016 | Jellus | G01R 33/5611 324/309 |
| 2016/0238685 | A1* | 8/2016 | Neji | G01R 33/4835 |
| 2017/0074960 | A1* | 3/2017 | Bhat | G01R 33/5616 |
| 2017/0108567 | A1* | 4/2017 | Bhat | G01R 33/5602 |
| 2017/0146624 | A1* | 5/2017 | Paul | G01R 33/4835 |
| 2017/0315202 | A1* | 11/2017 | Bhat | G01R 33/5617 |

FOREIGN PATENT DOCUMENTS

| | | | | |
|---|---|---|---|---|
| WO | WO 2013171119 A1 * | 11/2013 | | G01R 33/4835 |
| WO | WO 2014141055 A1 * | 9/2014 | | G01R 33/5611 |

OTHER PUBLICATIONS

Elster, AD, CIRPIRINHA, AD Elster, LLC. 2017.*
Abraham et al., Accuracy of 3D Dual Echo Steady State (DESS) MR Arthography to Quantify Acetabular Cartiltage Thickness, J Magn Reson Imaging, Nov. 2016.*
Robinson et al., Combining Phase Images From Multi-Channel RF Coils Using 3D Phase Offset Maps derived from a Dual Echo Scan, Magnetic Resonance in Medicine, 2011.*
Breuer et al., Controlled Aliasing in Volumetric Parallel Imaging (2D Caipirinha), Magnetic Resonance in Medicine, 2006.*
Yu et al., Clinical Application of Controlled Aliasing in Parallel Imaging Results in a Higher Acceleration (Caipirinha)—Volumetric Interpolated Breathhold (Vibe) Sequence for Gadoxetic Acid-Enchanced Liver MR Imaging, Journal of Magnetic Resonance Imaging, vol. 38. Copyright 2013 Wiley Periodicals, Inc.*
Barth et al., Simultaneous Multislice (SMS) Imaging Techniques, Magnetic Resonance in Medicine, vol. 75. Copyright 2016 Wiley Periodicals, Inc.*

* cited by examiner

MAGNETIC RESONANCE IMAGING METHOD AND APPARATUS

BACKGROUND OF THE INVENTION

Field of the Invention

The present invention is in the technical field of magnetic resonance imaging, and in particular concerns a three-dimensional magnetic resonance imaging method and apparatus.

Description of the Prior Art

Magnetic resonance imaging (MRI) is an imaging modality in which the phenomenon of magnetic resonance is utilized for the purpose of imaging. The basic principles of magnetic resonance are as follows. When an atomic nucleus contains a single proton, as is the case for the nuclei of the hydrogen atoms that are present throughout the human body, this proton exhibits spin and resembles a small magnet (dipole). The spin axes of these small magnets lack a definite coherence, and when an external magnetic field is applied, the small magnets will be rearranged according to the magnetic force lines of the external magnetic field; specifically, they will align in two directions, either parallel or anti-parallel to the magnetic force lines of the external magnetic field. The direction parallel to the magnetic force lines of the external magnetic field is called the positive longitudinal axis, while the direction anti-parallel to the magnetic force lines of the external magnetic field is called the negative longitudinal axis. The atomic nuclei have only a longitudinal magnetization component, which has both a direction and a magnitude. A radio frequency (RF) pulse of a specific frequency is used to excite the atomic nuclei in the external magnetic field, such that their spin axes deviate from the positive longitudinal axis or negative longitudinal axis, and resonance occurs—this is the phenomenon of magnetic resonance. Once the spin axes of the excited atomic nuclei have deviated from the positive or negative longitudinal axis, the atomic nuclei have a transverse magnetization component.

After emission of the RF pulse has ended, the excited atomic nuclei emit an echo signal, gradually releasing the absorbed energy in the form of electromagnetic waves, such that their phases and energy levels both return to the pre-excitation state. An image can be reconstructed by subjecting the echo signal emitted by atomic nuclei to further processing, such as spatial encoding.

In conventional three-dimensional (3D) MRI scanning methods, the parallel encoding is done in two encoding directions (i.e. two-dimensional parallel imaging). Thus, sensitivity variation in two encoding directions can be used to reconstruct an image, e.g. the 2D SENSE undersampling method and the 2D GRAPPA undersampling method. It has been demonstrated in practice that these two undersampling methods can significantly increase the quality of the reconstructed image and speed up image reconstruction. However, these two undersampling methods need sufficient sensitivity variation in the two encoding directions in order to successfully reconstruct an image, and for this reason, the two undersampling methods are significantly reliant upon the distribution of the coils. In addition, the standard 2D SENSE and 2D GRAPPA undersampling methods employ a rectangular undersampling model, which is implemented in each direction by a simple integer sampling reduction.

Figure 1A:
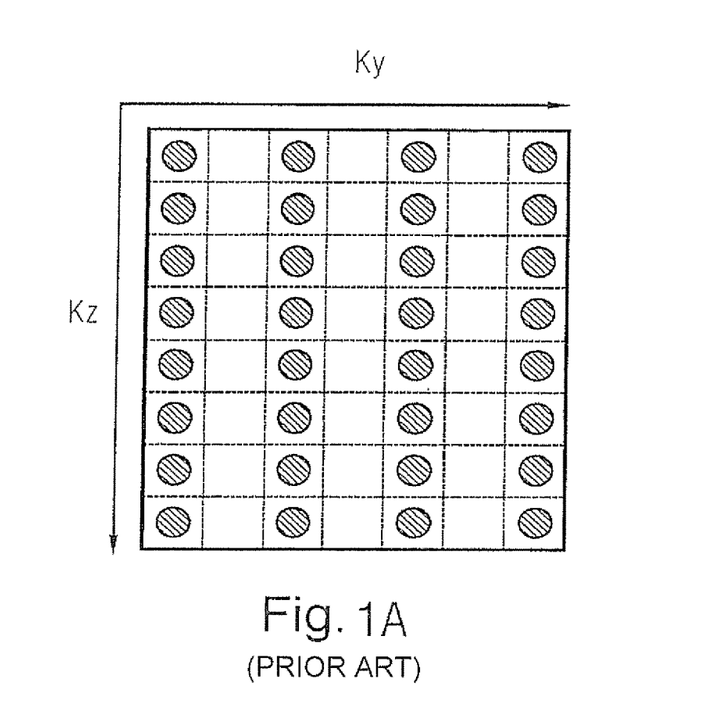
FIG. 1A is a schematic diagram of a model for undersampling k-space data in the ky direction according to the prior art.
Figure 1B:
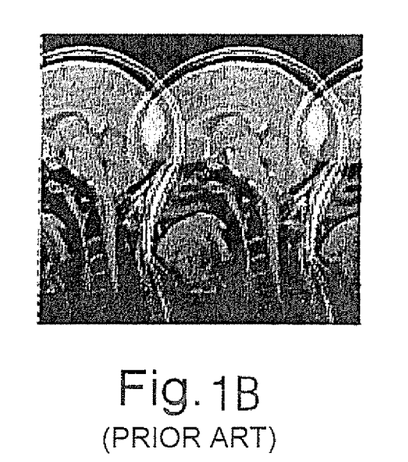
FIG. 1B is an image reconstructed according to the undersampling model of FIG. 1A.
Figure 2A:
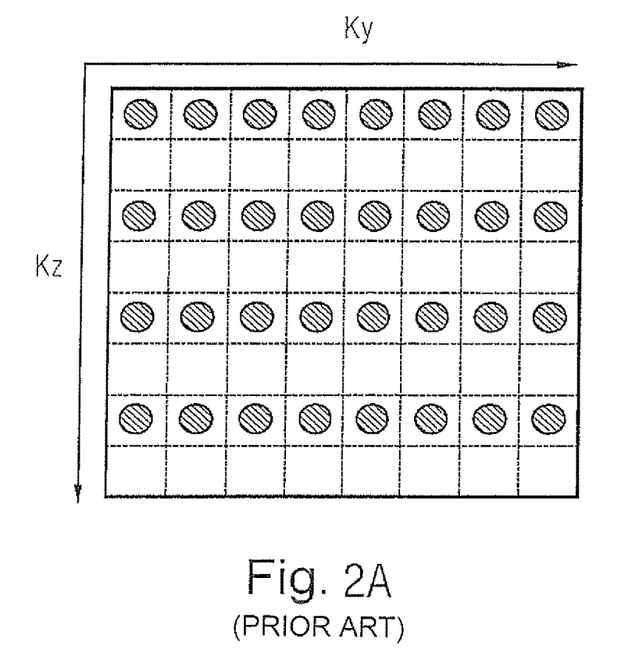
FIG. 2A is a schematic diagram of a model for undersampling k-space data in the kz direction according to the prior art.
Figure 2B:
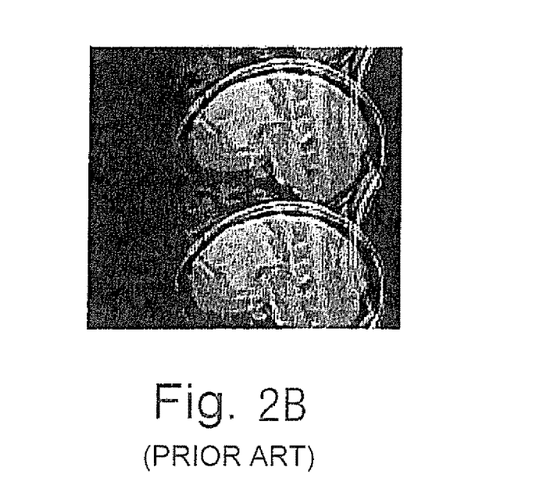
FIG. 2B is an image reconstructed according to the undersampling model of FIG. 2A.

FIG. 1A is a schematic diagram of a two-dimensional (2D) SENSE undersampling method model for k-space data according to the prior art; FIG. 1B is an image reconstructed according to the undersampling model of FIG. 1A. FIG. 2A is a schematic diagram of a 2D GRAPPA undersampling method model for k-space data according to the prior art; FIG. 2B is an image reconstructed according to the undersampling model of FIG. 2A. As FIG. 1A shows, in a 2D SENSE undersampling method for k-space data according to the prior art, k-space data are undersampled in the ky direction, i.e. every other datum is read in the ky direction (a round dot represents a datum that is read). As FIG. 1B shows, if undersampling is performed according to the model shown in FIG. 1A (i.e. undersampling in the ky direction), artifacts will appear in the image in the ky direction. By the same principle, as FIG. 2A shows, in a 2D GRAPPA undersampling method for k-space data according to the prior art, k-space data are undersampled in the kz direction, i.e. every second datum is read in the kz direction (a round dot represents a datum that is read). As FIG. 2B shows, if undersampling is performed according to the model shown in FIG. 2A (i.e. undersampling in the kz direction), artifacts will appear in the image in the kz direction.

In summary, artifacts will be produced if a standard 2D SENSE undersampling method or 2D GRAPPA undersampling method is used for image reconstruction in a 3D dual-echo or multi-echo scan sequence according to the prior art.

SUMMARY OF THE INVENTION

The present invention provides a 3D MRI method, that includes the steps of performing a 3D dual echo magnetic resonance scan, acquiring two sets of k-space data corresponding to the two echoes, respectively, and using a 2D CAIPIRINHA undersampling method on the two sets of k-space data to extract two sets of sampling data, respectively, and using the two sets of sampling data to reconstruct two initial magnetic resonance images, respectively, and synthesizing a final magnetic resonance image from the two initial magnetic resonance images.

Preferably, the 3D dual echo magnetic resonance scan sequence comprises a 3D dual echo steady state scan or a multi-echo data image combination scan.

Preferably, the step of synthesizing a final magnetic resonance image from the two initial magnetic resonance images comprises: weighting the two initial magnetic resonance images to synthesize the final magnetic resonance image; or taking the sum of squares of the two initial magnetic resonance images and then taking the square root.

Preferably, the step of acquiring two sets of k-space data corresponding to the two echoes, respectively, includes acquiring the two sets of k-space data corresponding to the two echoes, respectively, by spiral acquisition from the center to the periphery in a phase encoding direction.

Preferably, before performing the 3D dual echo magnetic resonance scan, the method includes performing a virtual 3D dual echo magnetic resonance scan.

The present invention also encompasses a 3D MRI apparatus that includes a scanner that is operated to perform a 3D dual echo magnetic resonance scan sequence to acquire two sets of k-space data corresponding to two echoes, respectively, an undersampling and extraction computer that applies a 2D CAIPIRINHA undersampling algorithm to the two sets of k-space data so as to extract two sets of sampling data, respectively. The apparatus also has a reconstruction computer that uses the two sets of sampling data to reconstruct two initial magnetic resonance images, respectively and a synthesis computer that synthesizes a final magnetic resonance image from the two initial magnetic resonance images.

The aforementioned computers can be combined as one computer, or can be two or more individual processors.

Preferably, the 3D dual echo magnetic resonance scan is a 3D dual echo steady state scan or a multi-echo data image combination scan.

Preferably, the synthesis computer is further designed to weight the two initial magnetic resonance images in order to synthesize the final magnetic resonance image. Alternatively the synthesis computer can synthesize the final image by forming the sum of squares of the two initial magnetic resonance images, and then taking the square root of this sum.

Preferably, the scanner is further used for acquiring the two sets of k-space data corresponding to the two echoes, respectively, using spiral acquisition trajectory proceeding from the center to the periphery of k-space in the phase encoding direction.

Preferably, the scanner is further used for performing a virtual 3D dual echo magnetic resonance scan before performing the 3D dual echo magnetic resonance scan.

It can be seen from the solution above that since staggering is carried out in the PE or SL direction when the 2D CAIPIRINHA undersampling method is applied to a 3D scan sequence, aliasing in parallel imaging can be controlled, so that a greater area in the center of the field of view (FOV) is undisturbed by aliasing. At the same time, coil sensitivity is increased, enabling further acceleration. Thirdly, the 2D CAIPIRINHA undersampling method generally uses a small acceleration factor, thereby ensuring a high signal to noise ratio. Finally, when the 2D CAIPIRINHA undersampling method is used in an MRI method carried out using a 3D fast spin sequence scan, the time taken to extract k-space data is significantly reduced, thereby shortening the scan time, while the use of "data block" reorganization improves image quality.

In summary, according to the embodiments of the present invention, the application of the 2D CAIPIRINHA undersampling method with corresponding reorganized "data blocks" to a 3D scan sequence, in particular a SPACE scan sequence, significantly improves the comfort of an examination subject as well as the overall image quality thereof.

DESCRIPTION OF THE PREFERRED EMBODIMENTS

The present invention is described in further detail below by way of specific embodiments, to explain the object, technical solution and advantages thereof.

Figure 3A:
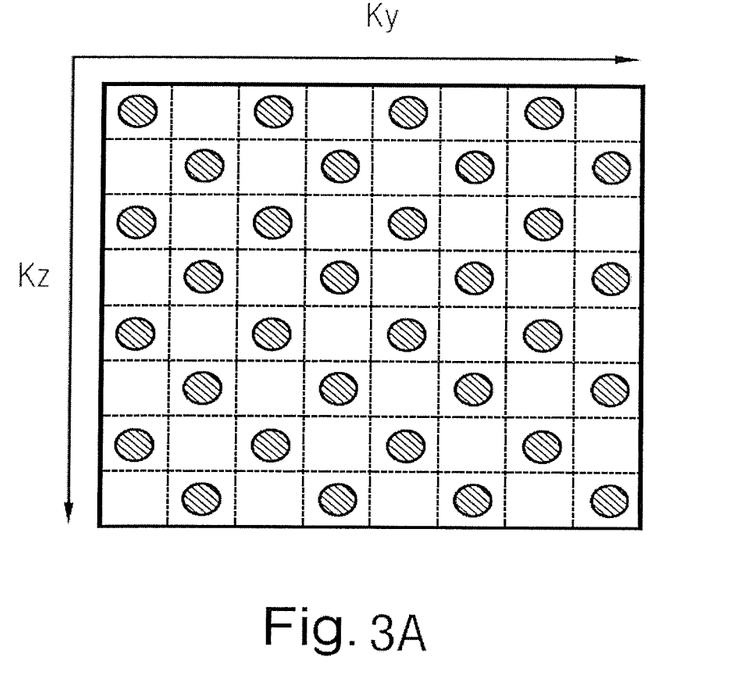
FIG. 3A is a schematic diagram of a model for undersampling k-space data according to a specific embodiment of, the present invention.
Figure 3B:
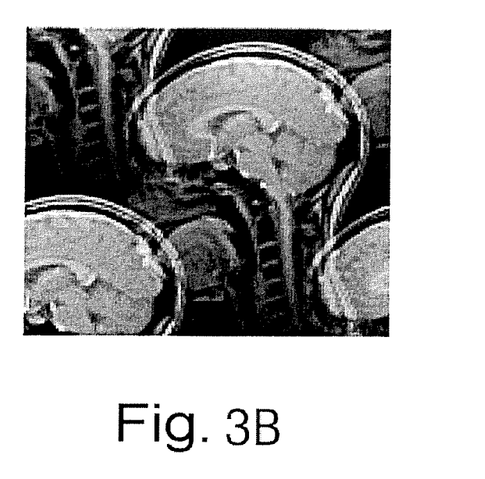
FIG. 3B is an image reconstructed according to the undersampling model of FIG. 3A.

The basis of the technical solution of a 3D MRI method according to a specific embodiment of the present invention is to apply a 2D CAIPIRINHA method to k-space data obtained by a 3D scan sequence, i.e. controlling aliasing in 2D parallel imaging by means of a modified phase encoding strategy. Specifically, FIG. 3A is a schematic diagram of a k-space data undersampling model according to a specific embodiment of the present invention; as FIG. 3A shows, the modified phase encoding strategy is formed by staggering the sampling positions in a sampled 2D phase encoding pattern. This is referred to as the modified sampling strategy hereinafter, i.e. a 2D CAIPIRINHA method is applied to k-space data obtained by a 3D scan sequence. FIG. 3B is an image reconstructed according to the undersampling model of FIG. 3A; as FIG. 3B shows, in a multi-dimensional scan sequence, the modified sampling strategy can make coil sensitivity variation more efficient, and thereby make the reconstruction conditions in parallel imaging more stable, so as to generate an image of higher quality.

With regard to scan sequences, 3D dual echo or multi-echo MRI scan sequences include the 3D Dual Echo Steady State (DESS) scan sequence and Multiple Echo Data Image Combination (MEDIC) scan sequence, etc., wherein the 3D Dual Echo Steady State (DESS) scan sequence is a more typical scan sequence. To illustrate the technical solution of the present invention, as an example, the 3D Dual Echo Steady State (DESS) scan sequence is used in the 3D MRI method according to a specific embodiment of the present invention. However, as stated above, the 3D MRI method is not limited to the 3D Dual Echo Steady State (DESS) scan sequence.

Figure 4:
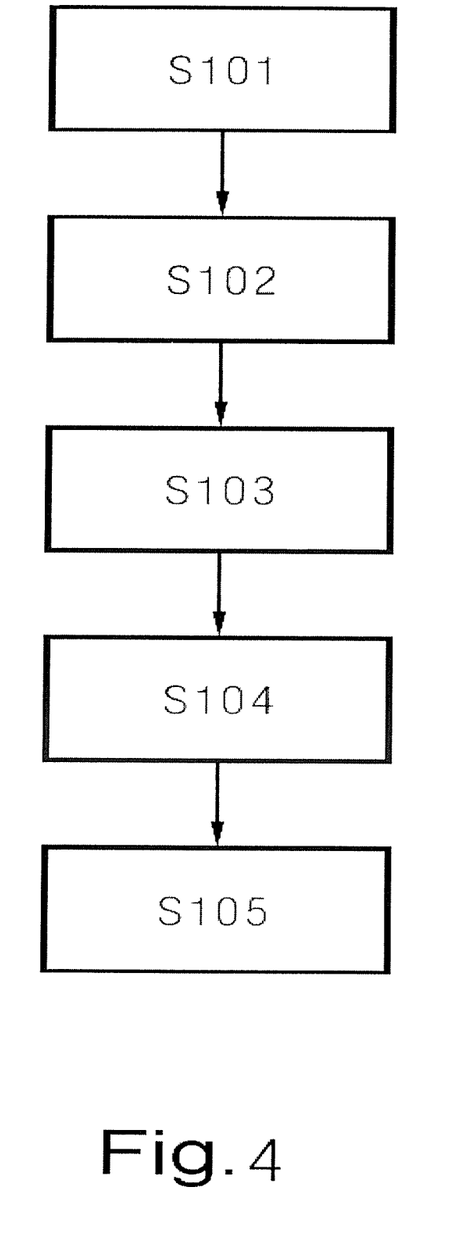
FIG. 4 is a diagram of the steps of the 3D MRI method according to a specific embodiment of the present invention.

FIG. 4 is a diagram of the steps of the 3D MRI method according to a specific embodiment of the present invention. As FIG. 4 shows, the 3D MRI method according to a specific embodiment of the present invention includes, in step S101, performing a 3D dual echo magnetic resonance scan sequence. Specifically, in the 3D DESS sequence, first an excitation RF pulse with an angle α is applied on the RF signal; after the α° excitation RF pulse, a α° rephasing RF pulse is applied; and a slice-select gradient $G_s$, phase encoding gradient $G_p$ and readout gradient $G_r$ are applied in a slice-select gradient direction, phase encoding gradient direction and readout gradient direction, respectively.

Next, as FIG. 4 shows, the 3D MRI method according to a specific embodiment of the present invention further includes, in step S102, acquiring two sets of k-space data corresponding to the two echoes, respectively. Specifically, during scanning, an Analog Digital Converter ADC acquires signals, wherein the ADC acquires two echo signals FISP echo and PSIF echo in a data acquisition timeslot AQ, and generates two sets of k-space data, respectively.

Next, as FIG. 4 shows, the 3D MRI method according to a specific embodiment of the present invention further includes, in step S103, using a 2D CAIPIRINHA undersampling method on the two sets of k-space data to extract two sets of sampling data, respectively.

Figure 5:
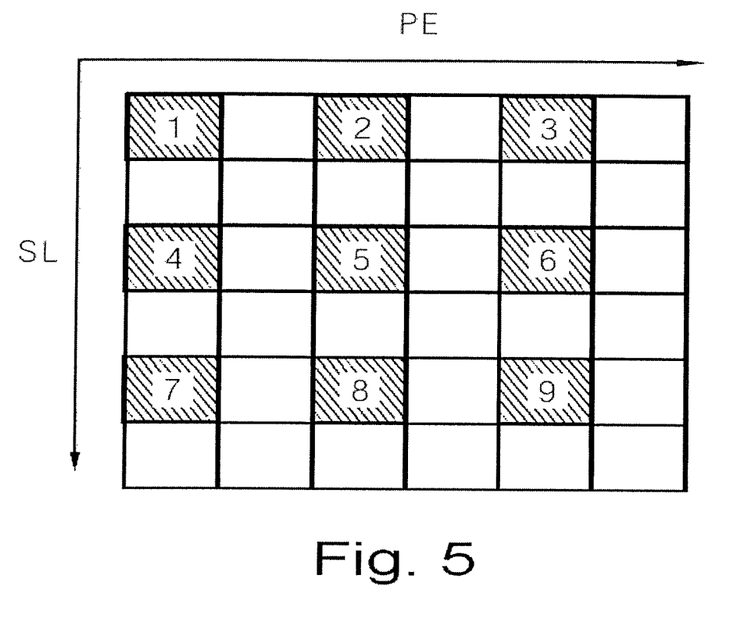
FIG. 5 is a schematic diagram of a 2D GRAPPA undersampling method used in a 3D MRI method in the prior art.
Figure 6:
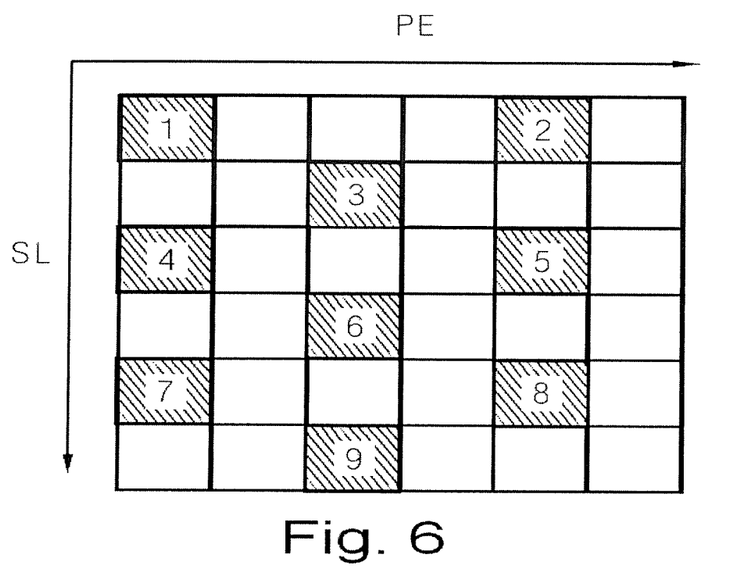
FIG. 6 is a schematic diagram of a first 2D CAIPIRINHA undersampling method used in a 3D MRI method according to a specific embodiment of the present invention.
Figure 7:
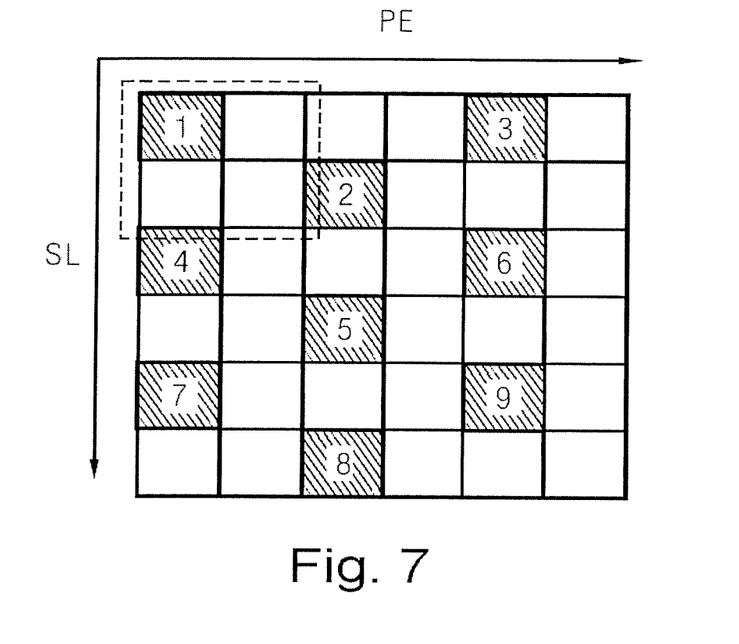
FIG. 7 is a schematic diagram of a second 2D CAIPIRINHA undersampling method used in a 3D MRI method according to a specific embodiment of the present invention.

FIG. 5 is a schematic diagram of a 2D GRAPPA undersampling method used in a 3D MRI method in the prior art; FIG. 6 is a schematic diagram of a first 2D CAIPIRINHA undersampling method used in a 3D MRI method according to a specific embodiment of the present invention; FIG. 7 is a schematic diagram of a second 2D CAIPIRINHA undersampling method used in a 3D MRI method according to a specific embodiment of the present invention.

The first 2D CAIPIRINHA undersampling method used in the 3D MRI method according to a specific embodiment of the present invention includes the following operations. First, a 2D CAIPIRINHA undersampling method is used on k-space data. As FIGS. 5 and 6 show, specifically, the first 2D CAIPIRINHA undersampling method used in the 3D MRI method according to a specific embodiment of the present invention is obtained by taking the 2D GRAPPA undersampling method as a starting point and then performing a staggering operation. Specifically, first of all, as FIG. 5 shows, the use of the 2D GRAPPA undersampling method on k-space data is taken as a starting point, i.e. the acceleration factor in both the PE direction and the SL direction is 2, in other words, undersampling is carried out by extracting every second k-space datum in the PE direction and the SL direction. Next, as FIG. 6 shows, every other sampled k-space datum in the PE direction is staggered by one k-space data unit in the SL direction, in other words, sampled k-space datum 2 between sampled k-space datum 1 and sampled k-space datum 3 in the PE direction is staggered with respect to k-space datum 1 and k-space datum 3 in the SL direction. The same principle applies to k-space data 4, 5 and 6 and k-space data 7, 8 and 9. The acceleration factors in the PE direction and SL direction may be set at will.

Secondly, the undersampled k-space data are extracted. Specifically, as shown in FIGS. 5 and 6, in the process of undersampling k-space data by the 2D GRAPPA undersampling method used in the 3D MRI method in the prior art, the sampled k-space data are extracted from left to right and from top to bottom (or in some other predetermined extraction sequence), so that the extracted k-space data is k-space data 1, 2, 3, 4, 5, 6, 7, 8 and 9, in that order, as FIG. 5 shows. In the process of undersampling k-space data by the first 2D CAIPIRINHA undersampling method used in the 3D MRI method according to a specific embodiment of the present invention, the sampled k-space data is extracted from left to right and from top to bottom, so that the extracted undersampled k-space data is k-space data 1, 3, 2, 4, 6, 5, 7, 9 and 8, in that order, as FIG. 6 shows. Clearly, as a result of the fact that the 2D CAIPIRINHA undersampling method staggers data with respect to the 2D GRAPPA undersampling method, the sequence in which sampling data is extracted is different in the two methods (performing 2D CAIPIRINHA undersampling with other acceleration factors or staggering patterns will give rise to other different data sequences). Different data sequences correspond to different signal attenuation patterns, and therefore will lead to shaking in the reconstructed magnetic resonance image.

The second 2D CAIPIRINHA undersampling method used in the 3D MRI method according to a specific embodiment of the present invention comprises the following operations. First of all, a 2D CAIPIRINHA undersampling method is used on k-space data. As FIG. 7 shows, in the second 2D CAIPIRINHA undersampling method used in the 3D MRI method according to a specific embodiment of the present invention, the first 2D CAIPIRINHA undersampling method used in the 3D MRI method according to a specific embodiment of the present invention is taken as a starting point, and the k-space data is then reorganized. Specifically, as in the dotted line box shown in FIG. 7, the k-space data are reorganized into "data blocks", wherein one "data block" refers to one basic parallel reconstruction data extraction unit, each basic parallel reconstruction data extraction unit comprising one datum to be sampled. Moreover, the size of the basic parallel reconstruction data extraction unit is determined by the acceleration factor in the two phase encoding directions (PE direction and SL direction). In other words, it is a matrix of a number of k-space data equal to the acceleration factor in the first phase encoding direction x a number of k-space data equal to the acceleration factor in the second phase encoding direction. For example: if the acceleration factor in the PE direction is 2, i.e. if undersampling is performed by extracting every second k-space datum in the PE direction, while the acceleration factor in the SL direction is 2, i.e. undersampling is performed by extracting every second k-space datum in the SL direction, then the size of the "data block" should be a unit of 2×2 k-space data. If the acceleration factor in the PE direction is 3, i.e. if undersampling is performed by extracting every third k-space datum in the PE direction, while the acceleration factor in the SL direction is 2, i.e. undersampling is performed by extracting every second k-space datum in the SL direction, then the size of the "data block" should be a unit of 3×2 k-space data. As FIG. 7 shows, if the acceleration factor is 2 in both the PE direction and the SL direction, then the k-space data is reorganized into "data blocks" of size 2×2. The size of the data block may also be a bigger k-space data matrix, for example: if the acceleration factor is 2 in both the PE direction and the SL direction, then the k-space data is reorganized into "data blocks" of size 4×4; it need only be ensured that the extraction of sampling data from k-space data in a "data block" will not lead to a situation where other different data sequences arise because the 2D CAIPIRINHA undersampling method is executed with different acceleration factors or staggering patterns.

Secondly, the undersampled k-space data is extracted. Specifically, as FIG. 7 shows, in the process of undersampling k-space data by the second 2D CAIPIRINHA undersampling method used in the 3D MRI method according to a specific embodiment of the present invention, the "data blocks" of reorganized sampled k-space data are extracted from left to right and from top to bottom (or in some other predetermined sequence), then the undersampled k-space data is extracted from the "data blocks". Thus the undersampled k-space data extracted is the k-space data 1, 2, 3, 4, 5, 6, 7, 8 and 9, in that order, as shown in FIG. 7.

Clearly, after the data reorganization, no matter what acceleration factor or staggering pattern is used in the 2D CAIPIRINHA undersampling method, as long as the "data blocks" of reorganized k-space data are extracted from left to right and from top to bottom, the subsequent extraction of sampling data from k-space data in the "data blocks" will not lead to a situation where other different data sequences arise because the 2D CAIPIRINHA undersampling method is executed with different acceleration factors or staggering patterns, so will not lead to different signal attenuation patterns, and therefore will not lead to shaking in the reconstructed magnetic resonance image. In short, "data blocks" formed by such a reorganization method can avoid different extraction sequences caused by displacement in different 2D CAIPIRINHA undersampling methods, and the different signal attenuation patterns which result, and disturbances in the reconstructed magnetic resonance image, which occurs as a consequence, and can thus improve image quality further.

Next, as FIG. 4 shows, the 3D MRI method according to a specific embodiment of the present invention further comprises: step S104, using the two sets of sampling data to reconstruct two initial magnetic resonance images, respectively.

Finally, as FIG. 4 shows, the 3D MRI method according to a specific embodiment of the present invention further comprises: step S105, synthesizing a final magnetic resonance image from the two initial magnetic resonance images. Specifically, data of the two initial magnetic resonance images are each multiplied by a weighting and then added to obtain a final magnetic resonance image; or data of the two initial magnetic resonance images are each squared and then added, and then the square root is taken to obtain a final magnetic resonance image.

The 3D MRI method according to a specific embodiment of the present invention uses an integrated mode calibration scan; a dual echo mode is similarly used for calibration scan data. The advantage of this is that the calibration scan data are more stable and more accurate.

Figure 8:
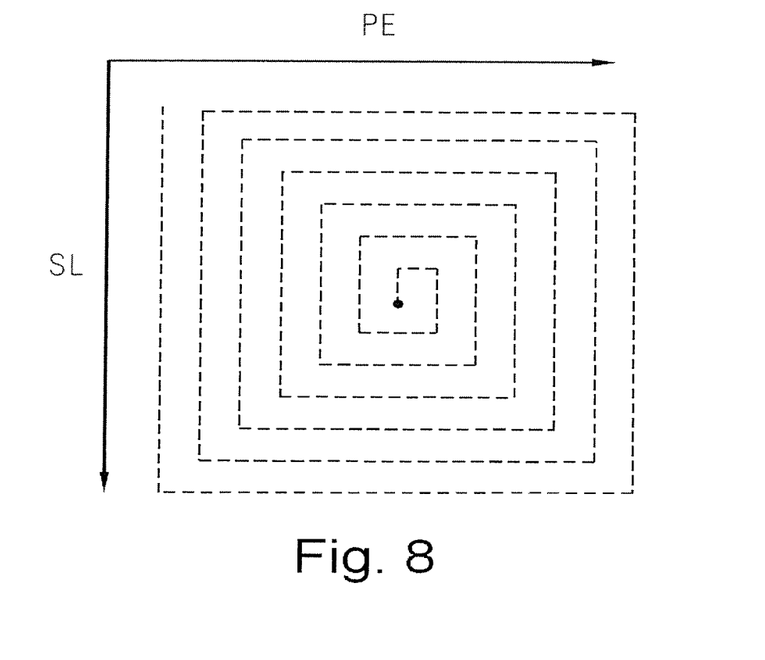
FIG. 8 is a schematic diagram of a k-space data acquisition method used in a 3D MRI method according to a specific embodiment of the present invention.

In addition, FIG. 8 is a schematic diagram of a k-space data acquisition method used in a 3D MRI method according to a specific embodiment of the present invention. As FIG. 8 shows, taking into account scan times which may be long due to the issue of patient comfort (this may affect the uniformity of image quality from patient to patient), the k-space data acquisition method used in the 3D MRI method according to a specific embodiment of the present invention implements a method of acquiring k-space data spirally from the center to the periphery from a phase encoding plane. In this way the image quality can be improved effectively, the reason being that: during a time period when a patient is relatively comfortable (the initial phase of scanning), and can easily keep steady, the method of acquiring k-space data spirally from the center to the periphery begins data acquisition from a central k space region, and can acquire low-frequency data (a central part) of k-space, the low-frequency data part being of critical importance to final image quality; during a time period when a patient is relatively tense (the final phase of scanning), and moves readily, movement interference data is encoded to high-frequency data (a peripheral part) of k-space, the high-frequency data (the peripheral part) having a relatively small impact on final image quality.

Before performing the 3D dual echo magnetic resonance scan sequence, the 3D MRI method according to a specific embodiment of the present invention further includes a step of performing a virtual scan, so as to ensure a stable signal acquisition process. Specifically, taking a 3D Dual Echo Steady State (DESS) scan sequence as an example, in order to enable the method of acquiring k-space data spirally from the center to the periphery from a phase encoding plane to acquire satisfactory data when acquiring data in the center of k-space (i.e. when data acquisition begins), it is necessary for echo data to be sampled after it has entered a steady state. Therefore, a virtual scan may be performed before formal scanning; during the virtual scan, only a 3D Dual Echo Steady State (DESS) scan sequence is emitted, but no data is acquired. Performing a virtual scan ensures that acquired data (i.e. data in the center of k-space) is already in a steady state when data acquisition begins, and is thus satisfactory data, so as to ensure image quality.

The specific undersampling method used is dependent on the coil and the anatomical position in the scan subject in the practical application. Thus, specific undersampling methods should be designed for different practical applications. In short, it is practical and feasible for the 2D CAIPIRINHA undersampling method with corresponding reorganized "data blocks" to be applied to a 3D scan sequence, in particular a SPACE scan sequence.

Furthermore, since staggering is carried out in the PE or SL direction when the 2D CAIPIRINHA undersampling method is applied to a 3D scan sequence, aliasing in parallel imaging can be controlled, so that a greater area in the center of the field of view (FOV) is undisturbed by aliasing. At the same time, coil sensitivity is increased, enabling further acceleration. Thirdly, the 2D CAIPIRINHA undersampling method generally uses a small acceleration factor, thereby ensuring a high signal to noise ratio. Finally, when the 2D CAIPIRINHA undersampling method is used in an MRI method carried out using a 3D fast spin sequence scan, the time taken to extract k-space data is significantly reduced, thereby shortening the scan time, while the use of "data block" reorganization improves image quality. Thus, as stated above, the application of the 2D CAIPIRINHA undersampling method with corresponding reorganized "data blocks" to a 3D scan sequence, in particular a SPACE scan sequence, significantly improves the comfort of an examination subject as well as the overall image quality thereof.

Figure 9:
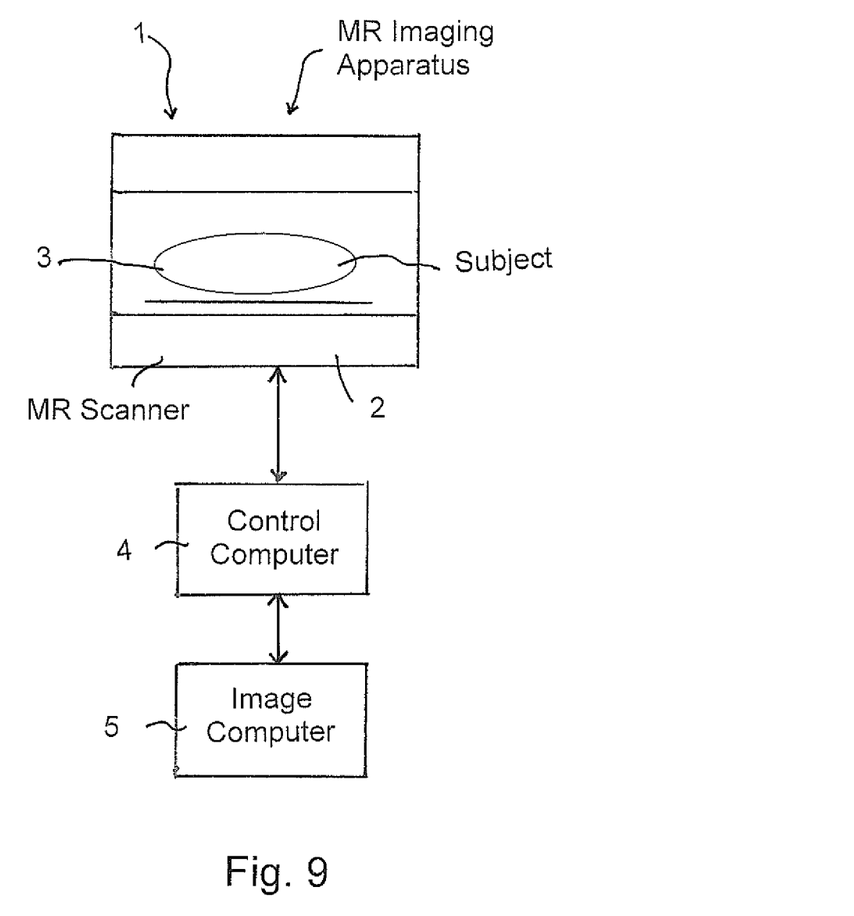
FIG. 9 is a block diagram of a magnetic resonance (MR) apparatus for implementing the method according to the invention.

A 3D MR imaging apparatus 1 in accordance with the invention is shown in FIG. 9, which includes an MR scanner 2 that is operated to perform a 3D dual echo MR scan sequence in order to acquire two sets of k-space data, corresponding to two echoes, respectively, from a subject 3. The MR imaging apparatus 1 has a control computer 4 that applies a 2D CAIPIRINHA undersampling algorithm to the two sets of k-space data, so as to extract two sets of sampling data, respectively therefrom. The MR imaging apparatus 1 also has an image (reconstruction) computer 5, which uses the two sets of sampling data to reconstruct two initial magnetic resonance images, respectively from the two sets of sampling data, and that also implements a synthesis of the two initial magnetic resonance images so as to produce a final MR image.

Although modifications and changes may be suggested by those skilled in the art, it is the intention of the inventor to embody within the patent warranted hereon all changes and modifications as reasonably and properly come within the scope of the inventor's contribution to the art.

I claim as my invention:

1. A method for generating a three-dimensional magnetic resonance (MR) image, comprising:
    operating an MR scanner, while a subject is situated in the MR scanner, to execute a 3D dual echo MR data acquisition sequence;
    operating said MR scanner in said 3D dual echo MR data acquisition sequence, in order to acquire two sets of raw MR data respectively from two echoes produced in said 3D dual echo MR data acquisition sequence;
    operating said MR scanner in said 3D dual echo magnetic resonance data acquisition sequence in order to activate a phase encoding gradient that establishes a phase encoding direction, and acquiring said two sets of raw MR data by acquiring raw MR data during each of said two echoes while said phase encoding gradient is activated, and entering said raw MR data, for each of said two sets, into k-space in an electronic memory, along a spiral trajectory in k-space starting from a center of k-space and proceeding from said center to a periphery of k-space in said phase encoding direction;

providing said two sets of k-space data to a computer and, in said computer, applying a 2D CAIPIRINHA undersampling to each of the two sets of k-space data, thereby extracting two sets of sampling data respectively from said two sets of k-space data;

in said computer, applying an image reconstruction algorithm to each of said two sets of sampling data, thereby obtaining two initially reconstructed MR images; and in said computer, synthesizing a final MR image of the subject from said two initially reconstructed MR images, and making the final MR image available at an output of the computer in electronic form as a data file.

2. A method as claimed in claim 1 comprising operating said MR scanner with said 3D dual echo MR data acquisition sequence selected from the group consisting of a 3D dual echo steady state MR data acquisition sequence, and a multi-echo data image combination MR data acquisition sequence.

3. A method as claimed in claim 1 comprising synthesizing said final MR image by respectively weighting said two initially reconstructed MR images.

4. A method as claimed in claim 1 comprising synthesizing said final MR image by forming a sum of squares of said two initially reconstructed MR images, followed by taking the square root of said sum.

5. A method as claimed in claim 1 comprising, before operating said MR scanner with said 3D dual echo MR data acquisition sequence, performing a virtual 3D dual echo MR data acquisition.

6. A magnetic resonance (MR) imaging apparatus, comprising:

an MR scanner adapted to receive a subject therein;

a control computer configured to operate the MR scanner, while the subject is situated in the MR scanner, to execute a 3D dual echo MR data acquisition sequence;

said control computer being configured to operate the MR scanner in said 3D dual echo magnetic resonance data acquisition sequence in order to acquire two sets of raw MR data respectively from two echoes produced in said 3D dual echo MR data acquisition sequence;

said control computer being configured to operate said MR scanner in said 3D dual echo magnetic resonance data acquisition sequence in order to activate a phase encoding gradient that establishes a phase encoding direction, and acquiring said two sets of raw MR data by acquiring raw MR data during each of said two echoes while said phase encoding gradient is activated, and entering said raw MR data, for each of said two sets, into k-space in an electronic memory, along a spiral trajectory in k-space starting from a center of k-space and proceeding from said center to a periphery of k-space in said phase encoding direction;

an image computer provided with said two sets of k-space data, said image computer being configured to apply a 2D CAIPIRINHA undersampling to each of the two sets of k-space data, thereby extracting two sets of sampling data respectively from said two sets of k-space data;

said image computer being configured to apply an image reconstruction algorithm to each of said two sets of sampling data, thereby obtaining two initially reconstructed MR images; and said image computer being configured to synthesize a final MR image of the subject from said two initially reconstructed MR images, and make the final MR image available at an output of the image computer in electronic form as a data file.

7. An MR imaging apparatus as claimed in claim 6 wherein said control computer is configured to operate said MR scanner with said 3D dual echo magnetic resonance data acquisition sequence selected from the group consisting of a 3D dual echo steady state MR data acquisition sequence, and a multi-echo data image combination data acquisition sequence.

8. An MR imaging apparatus as claimed in claim 6 wherein said control computer is configured to synthesize said final MR image by respectively weighting said two initially reconstructed MR images.

9. An MR imaging apparatus as claimed in claim 6 wherein said control computer is configured to synthesize said final MR image by forming a sum of squares of said two initially reconstructed MR images, followed by taking the square root of said sum.

10. An MR imaging apparatus as claimed in claim 6 wherein said control computer is configured to operate said MR scanner, before operating said MR scanner with said 3D dual echo MR data acquisition sequence, and to perform a virtual 3D dual echo MR data acquisition.

* * * * *